(12) United States Patent  
Nakagawara

(10) Patent No.: US 8,253,468 B2  
(45) Date of Patent: Aug. 28, 2012

(54) CLOCK GENERATING CIRCUIT

(75) Inventor: Chikashi Nakagawara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 13/020,948

(22) Filed: Feb. 4, 2011

(65) Prior Publication Data

US 2011/0273214 A1 Nov. 10, 2011

(30) Foreign Application Priority Data

May 7, 2010 (JP) ................................ 2010-107077

(51) Int. Cl.
*H03K 3/00* (2006.01)
(52) U.S. Cl. ...................... 327/291; 327/298; 327/171
(58) Field of Classification Search .................. None
See application file for complete search history.

(56) References Cited

U.S. PATENT DOCUMENTS

| | | | | |
|---|---|---|---|---|
| 5,670,915 | A * | 9/1997 | Cooper et al. ................ | 331/111 |
| 6,798,218 | B2 * | 9/2004 | Kasperkovitz ................ | 324/658 |
| 7,843,278 | B2 * | 11/2010 | Hsu ................................ | 331/78 |
| 2004/0183511 | A1 * | 9/2004 | Dening ......................... | 323/282 |
| 2005/0243894 | A1 * | 11/2005 | Chen et al. ................... | 375/139 |
| 2006/0221646 | A1 * | 10/2006 | Ye et al. ........................ | 363/13 |
| 2008/0130712 | A1 * | 6/2008 | Chava et al. ................. | 375/130 |

FOREIGN PATENT DOCUMENTS

| | | |
|---|---|---|
| JP | 2001-202153 | 7/2001 |
| JP | 2006-340333 | 12/2006 |
| JP | 2007-266908 | 10/2007 |

* cited by examiner

*Primary Examiner* — Tuan T Lam  
(74) *Attorney, Agent, or Firm* — Turocy & Watson, LLP

(57) ABSTRACT

According to one embodiment, a clock generating circuit includes first and second current generating circuits, first and second voltage generating circuits, first and second comparing circuits, a clock output circuit, a control circuit. The first current generating circuit is configured to generate a first current. The first voltage generating circuit is configured to generate a first voltage which increases or decreases according to a phase of a clock signal as time advances by the first current. The first comparing circuit is configured to compare the first voltage with a first threshold voltage to generate a first comparison result. The second current generating circuit is configured to generate a second current. The second comparing circuit is configured to compare the second voltage with a second threshold voltage to generate a second comparison result. The clock output circuit is configured to generate the clock signal whose phase inverts in synchronization with timing when the first and the second comparison results change. The control circuit is configured to generate a random number and configured to variably control at least one of the first current, the second current, the first threshold voltage and the second threshold voltage according to the random number.

16 Claims, 12 Drawing Sheets

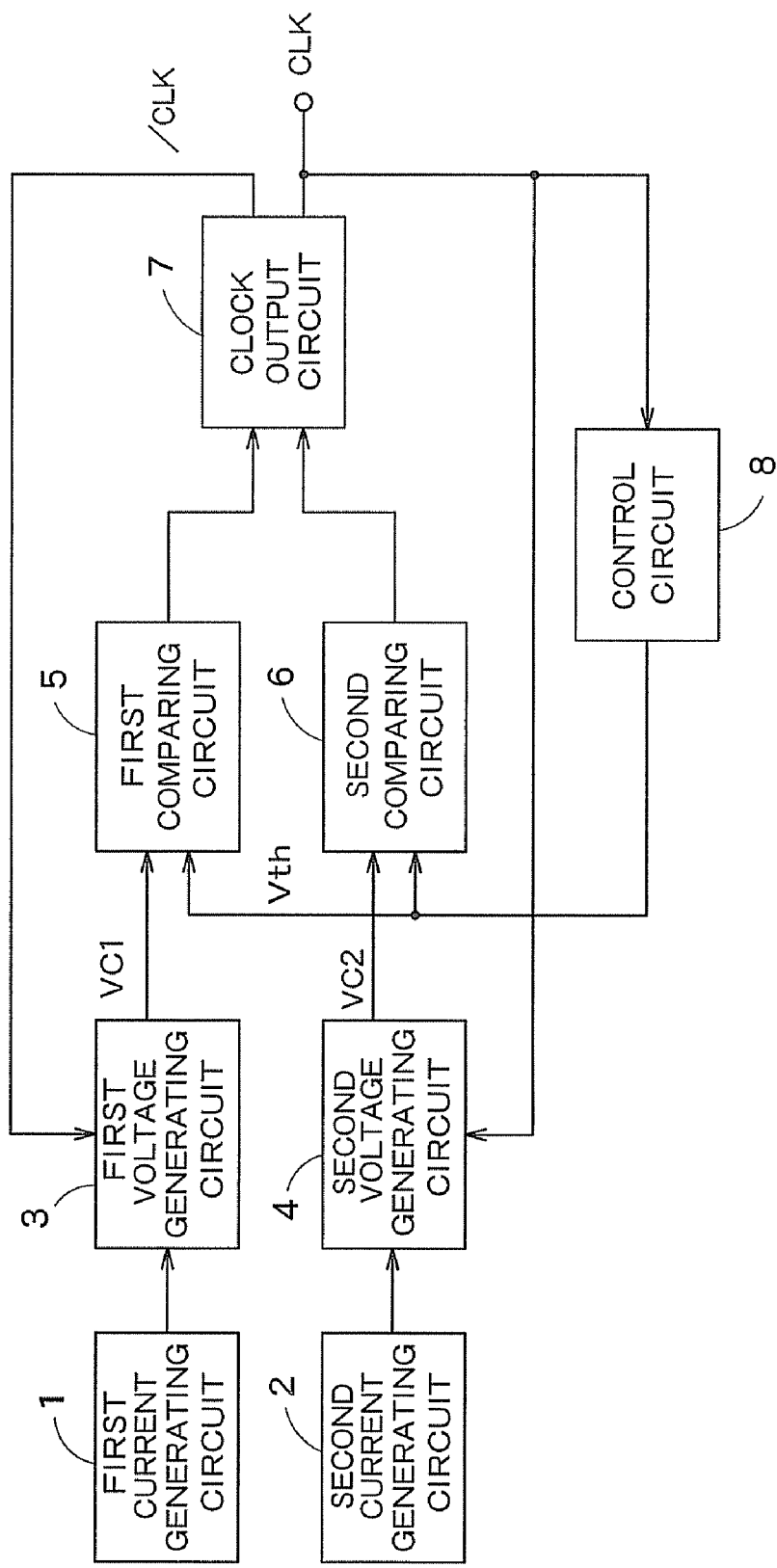
F I G. 1

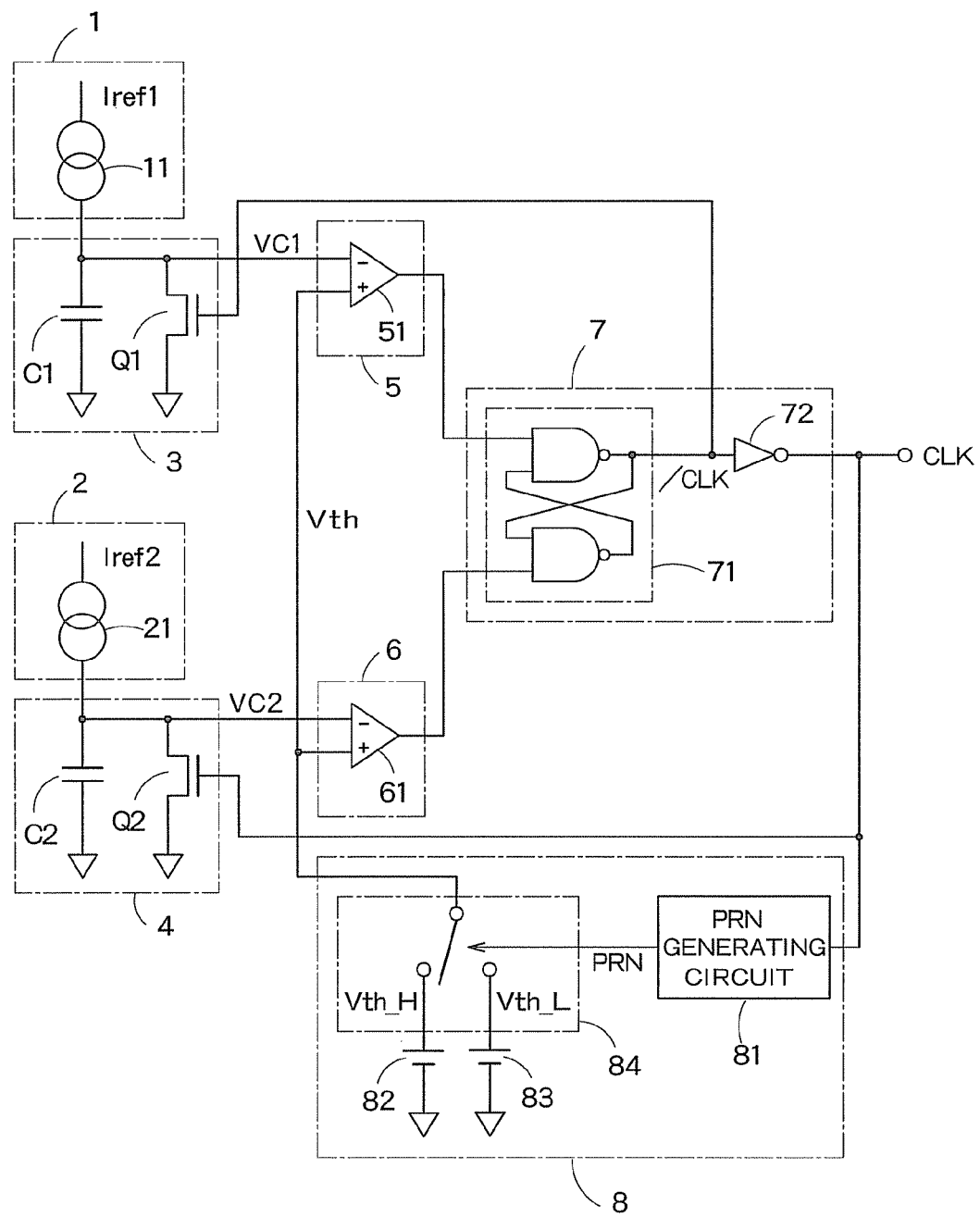
F I G. 2

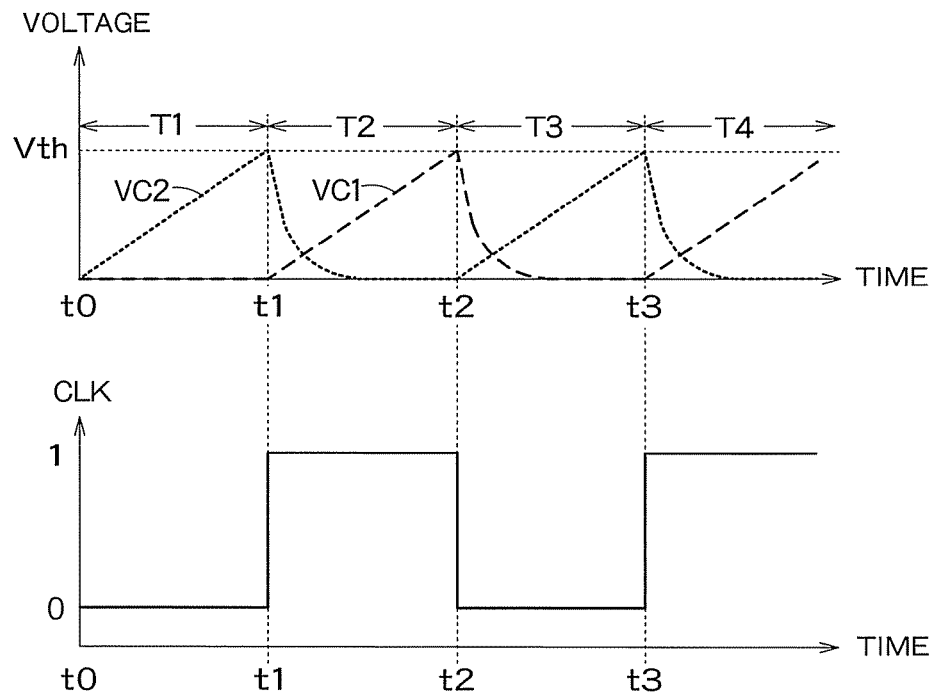
F I G. 3
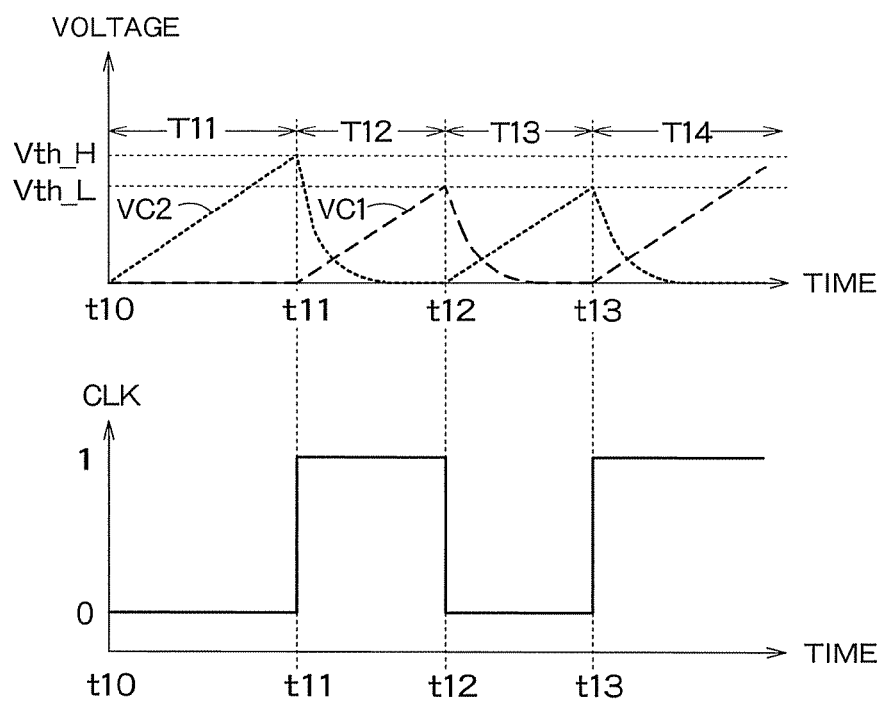
F I G. 4

| RPN[0] | RPN[1] | RPN[2] | RPN[3]=<br>RPN[0] XOR PRN[1] |
|--------|--------|--------|------------------------------|
| 1 | 0 | 0 | 1 |
| 0 | 0 | 1 | 0 |
| 0 | 1 | 0 | 1 |
| 1 | 0 | 1 | 1 |
| 0 | 1 | 1 | 1 |
| 1 | 1 | 1 | 0 |
| 1 | 1 | 0 | 0 |
| 1 | 0 | 0 | 1 |

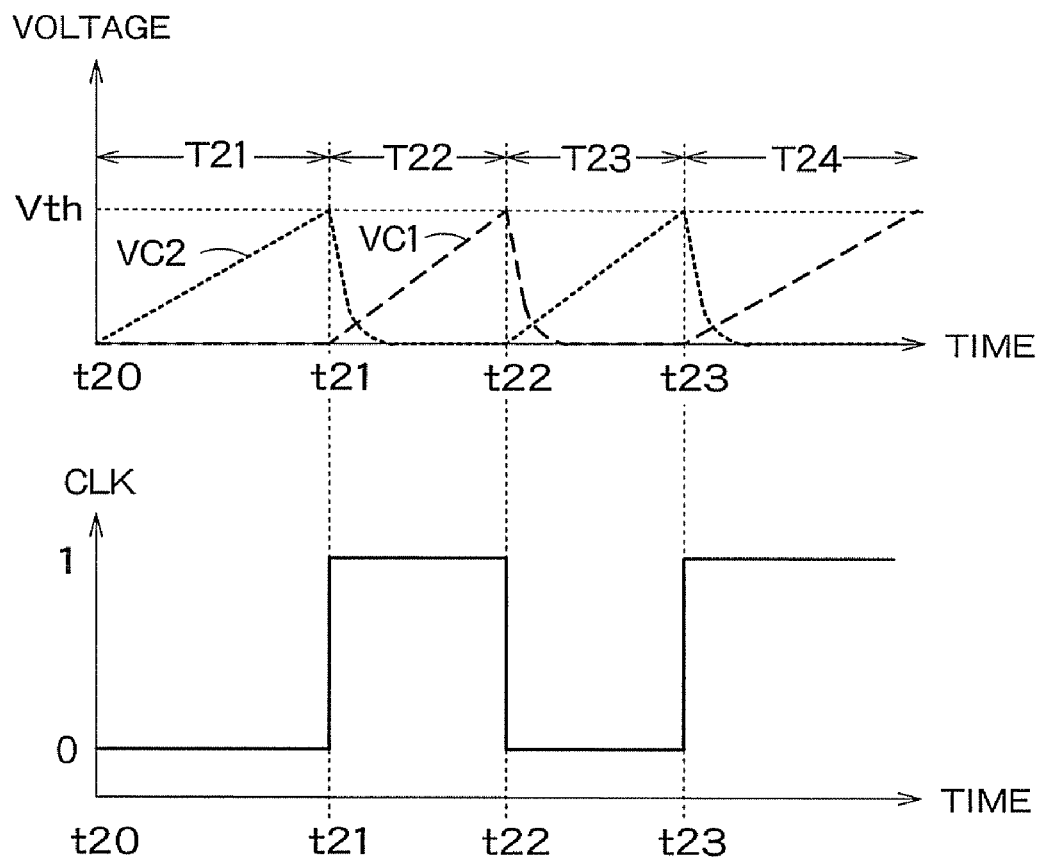
F I G. 11

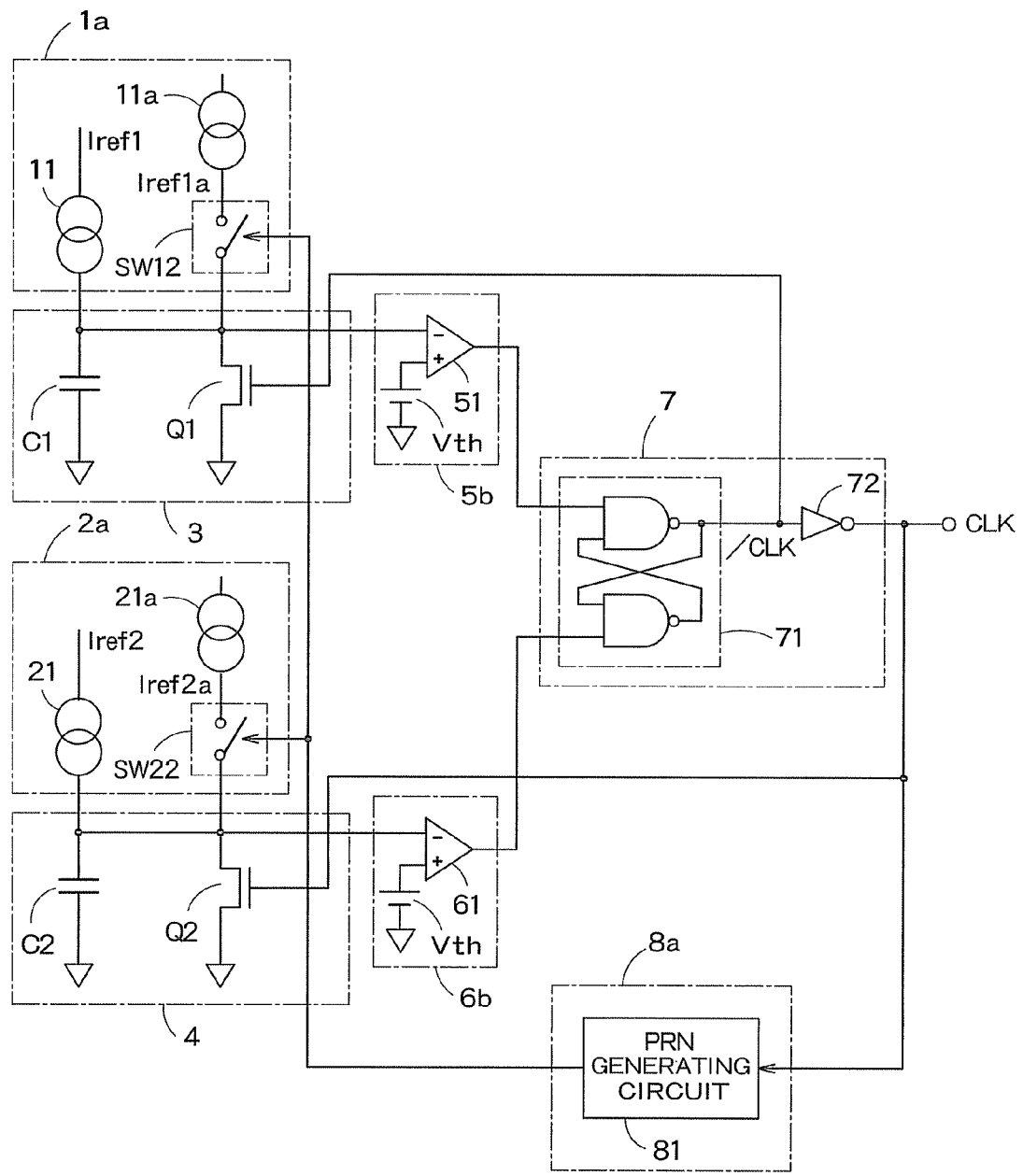
F I G. 12

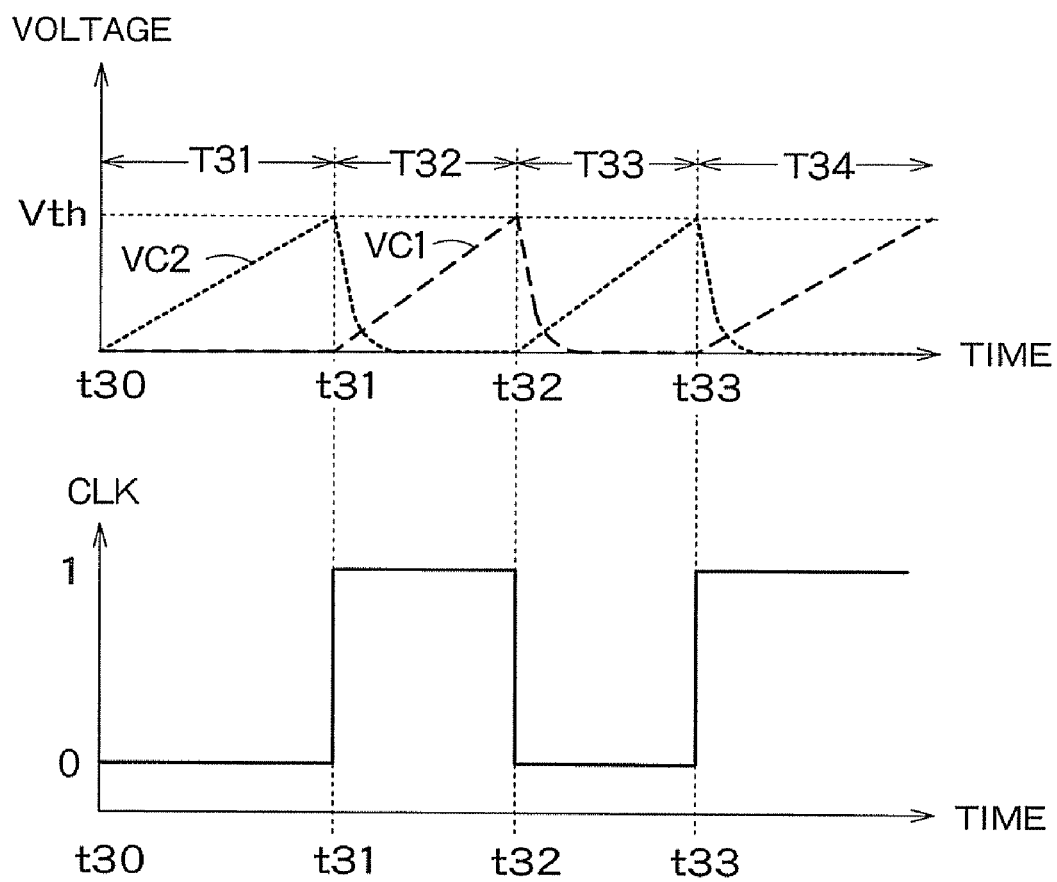
F I G. 13

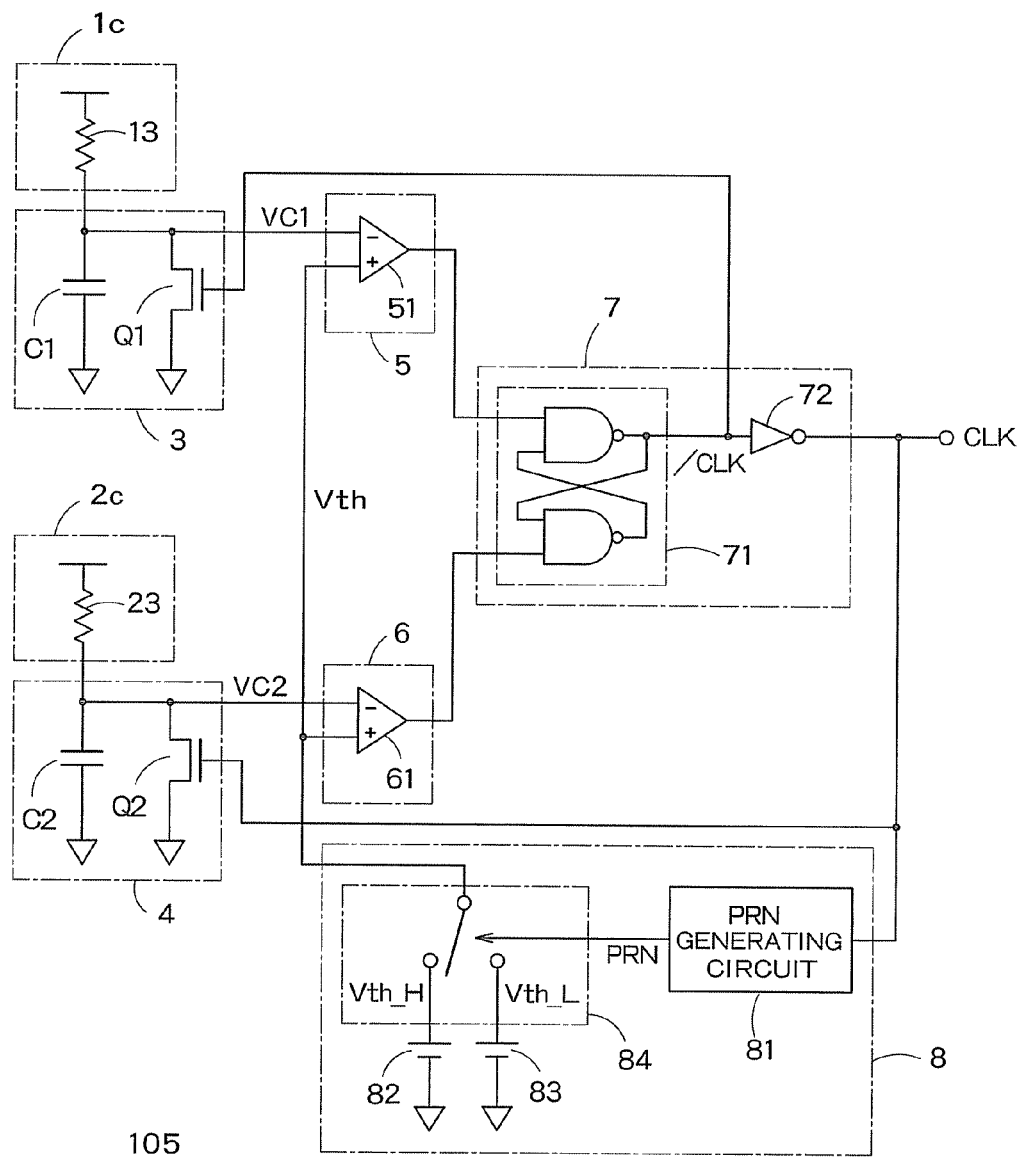
F I G. 15
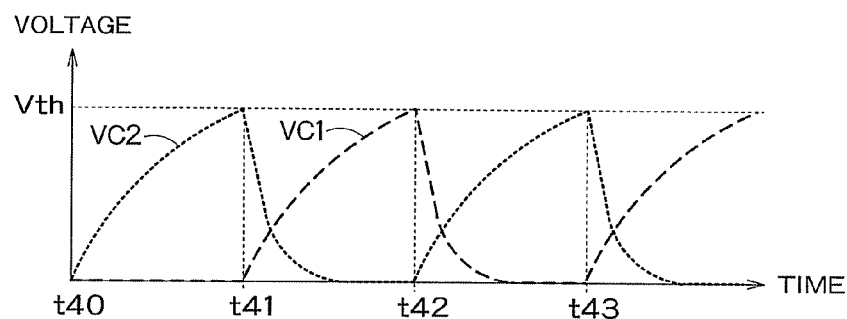
F I G. 16

CLOCK GENERATING CIRCUIT

CROSS REFERENCE TO RELATED APPLICATIONS

This application is based upon and claims the benefit of priority from the prior Japanese Patent Application No. 2010-107077, filed on May 7, 2010, the entire contents of which are incorporated herein by reference.

FIELD

Embodiments described herein relate generally to a clock generating circuit.

BACKGROUND

If digital circuits operate in synchronization with a clock signal whose frequency is always constant, large noise occurs and the noise has a bad influence to other electronic device. Especially, when a lot of electronic devices are placed in a limited space, for example, in a vehicle, this problem is remarkable. Therefore, various clock generating circuits are proposed for reducing the clock noise by using a spread spectrum technology.

Among the proposed clock generating circuits, it is a general manner to use a PLL (Phase-Locked Loop) circuit having a voltage-controlled oscillator which oscillates with a frequency depending on a voltage added by random noise to generate a spectrum-spread clock signal. However, because the PLL circuit is composed of a mixer, a loop filter, the voltage-controlled oscillator and a divider, there is a likelihood that a circuit volume may be large.

BRIEF DESCRIPTION OF THE DRAWINGS

FIG. 1 is a schematic configuration of a clock generating circuit 100 according to a first embodiment.

FIG. 2 is an internal configuration of each part of the clock generating circuit 100 in FIG. 1.

FIG. 3 is a timing chart showing an example of an operation of the clock generating circuit 100 of FIG. 2.

FIG. 4 is a timing chart showing an example of the operation of the clock generating circuit 100 of FIG. 2 when the threshold voltage Vth is variably controlled.

FIG. 11 is a timing chart showing an example of an operation of the clock generating circuit 102 of FIG. 10.

FIG. 12 is an internal configuration of a clock generating circuit 103 according to a fourth embodiment.

FIG. 13 is a timing chart showing an example of an operation of the clock generating circuit 103 of FIG. 12.

FIG. 15 is an internal configuration of a clock generating circuit 105, which is another modified example of FIG. 2.

FIG. 16 is a timing chart showing an example of an operation of the clock generating circuit 105.

DETAILED DESCRIPTION

Figure 5:
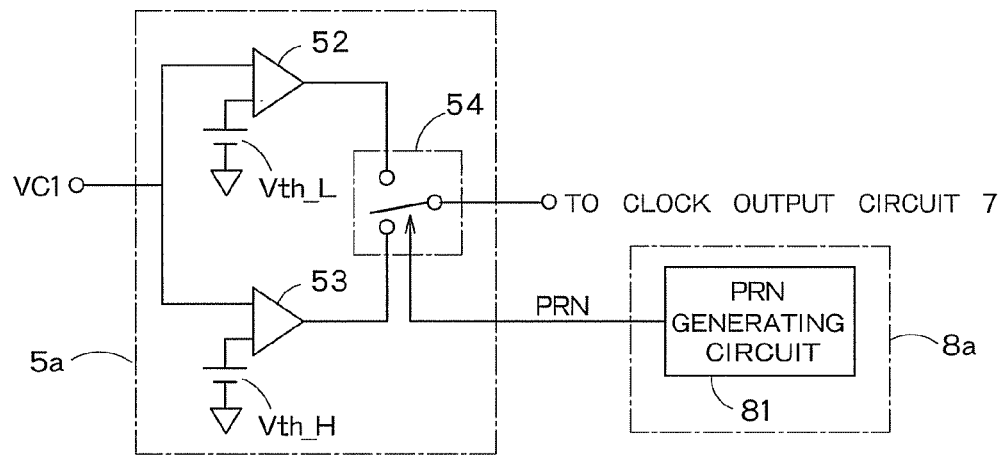
FIG. 5 is an internal configuration of the control circuit 8a and that of the first comparing circuit 5a of a clock generating circuit 101.

In general, according to one embodiment, a clock generating circuit includes a first current generating circuit, a first voltage generating circuit, a first comparing circuit, a second current generating circuit, a second comparing circuit, a clock output circuit, a control circuit. The first current generating circuit is configured to generate a first current. The first voltage generating circuit is configured to generate a first voltage which increases or decreases according to a phase of a clock signal as time advances by the first current. The first comparing circuit is configured to compare the first voltage with a first threshold voltage to generate a first comparison result. The second current generating circuit is configured to generate a second current. The second comparing circuit is configured to compare the second voltage with a second threshold voltage to generate a second comparison result. The clock output circuit is configured to generate the clock signal whose phase inverts in synchronization with timing when the first and the second comparison results change. The control circuit is configured to generate a random number and configured to variably control at least one of the first current, the second current, the first threshold voltage and the second threshold voltage according to the random number.

Embodiments will now be explained with reference to the accompanying drawings.

First Embodiment

FIG. 1 is a schematic configuration of a clock generating circuit 100 according to a first embodiment. The clock generating circuit 100 of FIG. 1 has first and second current generating circuits 1 and 2, first and second voltage generating circuits 3 and 4, first and second comparing circuits 5 and 6, a clock output circuit 7 and a control circuit 8. The clock generating circuit 100 can be implemented by a chip or can be implemented by discrete parts. A clock signal CLK generated by the clock generating circuit 100 is used in a controller of a motor in a vehicle (not shown).

The first current generating circuit 1 generates a constant current (first current) Iref1 to provide it to a first voltage generating circuit 3. The first voltage generating circuit 3 generates a voltage VC1 (first voltage) which increases or decreases as time advances according to a phase of a inverted clock signal /CLK, which is obtained by inverting a phase of the clock signal CLK generated by the clock output circuit 7. The first comparing circuit 5 compares the voltage VC1 with a threshold voltage (first threshold voltage) Vth to provide the comparison result (first comparison result) to the clock output circuit 7.

The second current generating circuit 1 generates a constant current (second current) Iref2 to provide it to a second voltage generating circuit 4. The second voltage generating circuit 4 generates a voltage VC2 (second voltage) which increases or decreases as time advances according to the phase of the clock signal CLK generated by the clock output circuit 7. The second comparing circuit 6 compares the voltage VC2 with a threshold voltage (second threshold voltage)

Vth to provide the comparison result (second comparison result) to the clock output circuit 7.

The clock output circuit 7 generates the clock signal CLK whose phase inverts in synchronization with the comparison results of the first and the second comparing circuits 5 and 6. The control circuit 8 generates a pseudo random noise in synchronization with the clock signal CLK and variably controls the threshold voltage Vth according to the pseudo random noise. Here, the pseudo random noise means a random number having a cycle and the value of which varies in a random manner in the cycle.

FIG. 2 is an internal configuration of each part of the clock generating circuit 100 in FIG. 1.

The first current generating circuit 1 has a current source 11 for generating the constant current Iref1.

The first voltage generating circuit 3 has a capacitor (first capacitor) C1 and an NMOS (N-type Metal-Oxide-Semiconductor) transistor Q1, which are connected in parallel between the current source 11 and a ground terminal. The inverted clock signal /CLK is inputted to the gate of the transistor Q1. When the inverted clock signal /CLK is low, the capacitor C1 is charged by the constant current Iref1 because the transistor Q1 turns off. Therefore, the first voltage generating circuit 3 generates the voltage VC1 which increases linearly as time advances. The relationship between the voltage VC1 and the time t is expressed by the following equation (1).

$$VC1 = (Iref1/C1)*t \quad (1)$$

On the other hand, when the inverted clock signal /CLK is high, the transistor Q1 turns on, and the source and the drain thereof are electrically connected. Therefore, the first voltage generating circuit 3 generates the voltage VC1 which decreases as time advances.

The first comparing circuit 5 has a comparator 51. The threshold voltage Vth and the voltage VC1 are inputted to the positive and the negative input terminals of the comparator 51, respectively. When VC1<Vth, the first comparing circuit 5 outputs high, and when Vth≦VC1, the first comparing circuit 5 outputs low.

Internal configurations of the second current generating circuit 1 and the second comparing circuit 6 are similar to those of the first current generating circuit 1 and the first comparing circuit 5, respectively. Furthermore, an internal configuration of the second voltage generating circuit 4 is similar to that of the first voltage generating circuit 3 except that the clock signal CLK is inputted to a gate of a transistor Q2. Because the transistor Q2 turns off when the clock signal CLK is low, the capacitor (second capacitor) C2 in the second voltage generating circuit 4 is charged. Therefore, the second voltage generating circuit 4 generates the voltage VC2 which increases as time advances. The relationship between the voltage VC2 and the time t is expressed by the following equation (2).

$$VC2 = (Iref2/C2)*t \quad (2)$$

The clock output circuit 7 has a flip-flop 71 and an inverter 72. The output signals of the first and the second comparing circuits are inputted to the flip-flop 71, and the flip-flop 71 outputs the inverted clock signal /CLK. The flip-flop 71 sets the inverted clock signal /CLK to be high in synchronization with timing when the output signal of the first comparing circuit 5 changes from high to low, while the flip-flop 71 sets the inverted clock signal /CLK to be low in synchronization with timing when the output signal of the second comparing circuit 6 changes from high to low. In other cases, the flip-flop 71 holds the output value. The inverter 72 inverts the phase of the clock signal CLK to generate the clock signal CLK.

The control circuit 8 has a pseudo random noise generating circuit 81, a voltage source (first voltage source) 82, a voltage source (second voltage source) 83, and a selecting circuit 84. The pseudo random noise generating circuit 81 generates the pseudo random noise PRN of "1" bit in synchronization with the clock signal CLK. The voltage source 82 generates a high reference voltage (first reference voltage) Vth_H. The voltage source 83 generates a low reference voltage (second reference voltage) Vth_L. The selecting circuit 84 selects the low reference voltage Vth_L when the pseudo random noise PRN is low, while the selecting circuit 84 selects the high reference voltage Vth_H when the pseudo random noise PRN is high. The selecting circuit 84 provides the selected reference voltage to the first and the second comparing circuits 5 and 6 as the threshold voltage Vth.

The constant currents Iref1 and Iref2, the capacitors C1 and C2, the threshold voltage Vth of the first and the second comparing circuits 5 and 6 can be different, respectively. However, they are assumed to be the same if not otherwise specified.

FIG. 3 is a timing chart showing an example of an operation of the clock generating circuit 100 of FIG. 2. Here, delay of each of the comparators 51 and 61, the flip-flop 71 and wires will be ignored. Firstly, the threshold voltage, which is always constant, is provided to the first and the second comparing circuits 5 and 6.

At time t0, it is assumed that the inverted clock signal /CLK is high and the clock signal CLK is low. Because the inverted clock signal /CLK is high at time t0, the transistor Q1 in the first voltage generating circuit 3 turns on, and the source and the drain thereof are electrically connected. Therefore, the voltage VC1 is 0V. On the other hand, because the clock signal CLK is low, the transistor Q2 in the second voltage generating circuit 4 turns off. Therefore, the capacitor C2 is charged by the constant current Iref2, and the voltage VC2 increases linearly according to the above equation (2).

When the voltage VC2 becomes the threshold voltage Vth at time t1, the output signal of the second comparing circuit 6 changed from high to low. In synchronization therewith, the flip-flop 71 sets the inverted clock signal /CLK to be low. Furthermore, the inverter 72 sets the clock signal CLK to be high.

When the clock signal CLK is set to be high, the transistor Q2 in the second voltage generating circuit 4 turns on, and the source and the drain thereof are electrically connected. Therefore, the voltage VC2 decreases drastically to be 0V. When the voltage VC2 becomes lower than the threshold voltage Vth, the output of the second comparing circuit 6 becomes high again. However, the inverted clock signal /CLK outputted by the flip-flop 71 stays in low. Therefore, the clock signal CLK stays is high.

On the other hand, because the inverted clock signal /CLK becomes low at time t1, the transistor Q1 in the first voltage generating circuit 3 turns off. Therefore, the capacitor C1 is charged by the constant current Iref1, and the voltage VC1 increases linearly according to the above equation (1).

When the voltage VC1 becomes the threshold voltage Vth at time t2, the output signal of the first comparing circuit 5 changed from high to low. In synchronization therewith, the flip-flop 71 sets the inverted clock signal /CLK to be high. Furthermore, the inverter 72 sets the clock signal CLK to be low.

When the inverted clock signal /CLK is set to be high, the transistor Q1 in the first voltage generating circuit 3 turns on, and the source and the drain thereof are electrically connected. Therefore, the voltage VC1 decreases drastically to be 0V. When the voltage VC1 becomes lower than the threshold voltage Vth, the output of the first comparing circuit 5 becomes high again. However, the inverted clock signal /CLK outputted by the flip-flop 71 stays in high. Therefore, the clock signal CLK stays is low.

As described above, the clock signal CLK is set to be low or high alternately. When the threshold voltage Vth is constant, a term T1 (time t0 to t1) when the clock signal CLK is low is the same as a term T2 (time t1 to t2) when the clock signal CLK is high. For example, the term T1 is one required for the voltage VC2 to become the threshold voltage Vth. Therefore, the term T1 is expressed by the following equation (3).

$$T1 = C2 * Vth / Iref2 \quad (3)$$

Because the term T1 corresponds to a half cycle, the frequency f of the clock signal CLK is expressed by the following equation (4).

$$f = 1/(2*T1) = Iref2/(2*C2*Vth) \quad (4)$$

For example, when it is assumed that Iref2=1 mA, C2=5 pF, Vth=1V, the clock generating circuit 100 can generate the clock signal CLK having the frequency f of 100 MHz.

Here, if the threshold voltage Vth is constant, the frequency of the clock signal CLK is also constant, which may cause large noise. Therefore, in the present embodiment, the threshold voltage Vth is variably controlled by the control circuit 8 to disperse the frequency of the clock signal CLK, thereby targeting reducing the clock noise.

FIG. 4 is a timing chart showing an example of the operation of the clock generating circuit 100 of FIG. 2 when the threshold voltage Vth is variably controlled. Hereinafter, differences from FIG. 3 will be mainly explained.

When the pseudo random noise PRN is assumed to be high at time t10, the high reference voltage Vth_H is inputted to the first and the second comparing circuits 5 and 6 as the threshold voltage Vth. In this case, the voltage VC2 becomes the high reference voltage Vth_H at time t11, and the clock signal CLK changes from low to high. A term when the clock signal CLK is low (time t10 to t11) is defined as T11.

At time t11, the phase of the clock signal CLK inverts. In synchronization therewith, it is assumed that the pseudo random noise RPN generated by the pseudo random noise generating circuit 81 becomes low. Then, the low reference voltage Vth_L is inputted to the first and the second comparing circuits 5 and 6 as the threshold voltage Vth. Because the low reference voltage Vth_L is lower than the high reference voltage Vth_H, the voltage VC1 becomes the low reference voltage Vth_L after a term T12 passes from the time t11, and the clock signal CLK changes from high to low. Here, the term T12 is shorter than the term T11.

A half cycle T11 of the clock signal CLK when the pseudo random noise PRN is high is longer than a half cycle T12 of the clock signal CLK when the pseudo random noise PRN is low. The frequency f1 for pseudo random noise PRN of high and the frequency f2 for pseudo random noise PRN of low are expressed by the following equations (5), (6), respectively.

$$f1 = 1/(2*T11) = Iref2/(2*C2*Vth\_H) \quad (5)$$

$$f2 = 1/(2*T12) = Iref1/(2*C2*Vth\_L) \quad (6)$$

As described above, the frequency of the clock signal CLK can be changed according to the pseudo random noise PRN. For example, when it is assumed that Vth_H=1V, Vth_L=0.9V in the above numeric example, the clock signal CLK is generated whose frequency is dispersed into 100 MHz or 110 MHz.

As stated above, in the first embodiment, the pseudo random noise generating circuit 81 is provided in the control circuit 8 to change the threshold voltage Vth of the first and the second comparing circuits 5 and 6 in two values of Vth_H and Vth_L according to the pseudo random noise PRN. Therefore, the frequency of the clock signal CLK is dispersed into two values, thereby reducing the clock noise. When the clock noise is reduced, disturbances to radio broadcasting can be prevented, for example. Accordingly, when the clock generating circuit 100 of the present embodiment is used in a controller of a motor in a vehicle, and a radio broadcast receiver is placed close to the clock generating circuit 100, the radio broadcast is played-back with low noise. Furthermore, because the clock signal CLK is generated by charging and discharging the capacitors C1 and C2, the circuit volume of the clock generating circuit 100 can be reduced.

Note that by providing two or more voltage sources each of which generates different voltage in the control circuit 8 and generating the pseudo random noise having a plurality of bits by the pseudo random noise generating circuit 81, the threshold voltage Vth provided to the first and the second comparing circuits 5 and 6 can be changed. The frequency of the clock signal CLK can be further dispersed, thereby further reducing the clock noise.

FIG. 5 is an internal configuration of the control circuit 8a and that of the first comparing circuit 5a of a clock generating circuit 101, which is a modified example of the clock generating circuit 100 of FIG. 2. An internal configuration of the second comparing circuit is similar to that of the first comparing circuit 5a, and other circuits are similar to the corresponding circuits of FIG. 2. Because of this, the other circuits are omitted in FIG. 5.

The control circuit 8a has only a pseudo random noise generating circuit 81. The first comparing circuit 5a has first and second comparators 52 and 53, and a selecting circuit 54. The first comparator 52 compares the voltage VC1 with the low reference voltage Vth_L. The second comparator 53 compares the voltage VC1 with the high reference voltage Vth_H. The selecting circuit 54 selects the output of the first comparator 52 or that of the second comparator 53 according to the pseudo random noise PRN generated by the pseudo random noise generating circuit 81 to provide the selected output to the clock output circuit 7. In this way, it may be possible to simplify the control circuit 8a and compare the voltage VC1 with the threshold voltage in the first comparing circuit 5a, instead.

Second Embodiment

In a second embodiment, which will be described below, the threshold voltage Vth is simply changed in a plurality of values by using a D/A converter.

Figure 6:
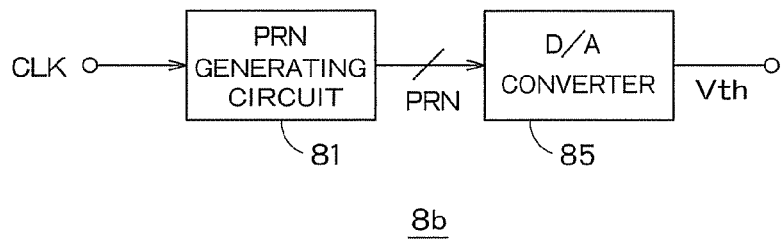
FIG. 6 is an internal configuration of the control circuit 8b of the clock generating circuit according to a second embodiment.

FIG. 6 is an internal configuration of the control circuit 8b of the clock generating circuit according to the second embodiment. Because the other circuits are similar to FIG. 2, they are omitted. The control circuit 8b has a pseudo random noise generating circuit 81 and a D/A converter 85. The pseudo random noise PRN generated by the pseudo random noise generating circuit 81 of FIG. 6 is a digital signal having a plurality of bits. The D/A converter 85 converts the pseudo random noise PRN to an analog signal to provide it to the first and the second comparing circuits 5 and 6 as the threshold voltage Vth. When the pseudo random noise PRN is, for example, has two bits, the D/A converter 85 can generate four threshold voltages Vth. Therefore, the frequency of the clock signal CLK is dispersed into four values, thereby reducing the clock noise.

Note that not the full range but an appropriate range of the output voltage of the D/A converter 85 can be used. For example, when the input signal of the D/A converter 85 has eight bits, and the output voltage is 0V to 5V, the D/A converter 85 may output four analog voltages around 1V among output voltages of "256" steps.

Hereinafter, an example of the internal configuration of the pseudo random noise generating circuit 81 and that of the D/A converter 85 used in the present embodiment will be explained.

Figure 7:
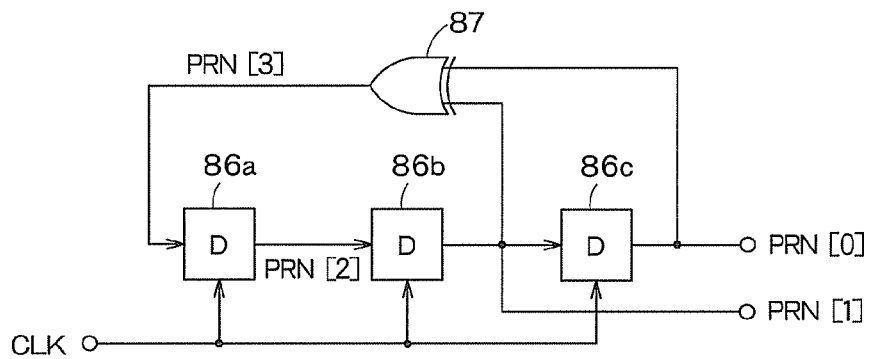
FIG. 7 is a block diagram showing an example of the internal configuration of the pseudo random noise generating circuit 81.

FIG. 7 is a block diagram showing an example of the internal configuration of the pseudo random noise generating circuit 81. The pseudo random noise generating circuit 81 of FIG. 7 has three delay elements (D) 86a to 86c and an XOR (exclusive OR) circuit 87. Because the pseudo random noise generating circuit 81 of FIG. 7 can generate the pseudo random noise PRN only by the delay elements 86a to 86c and the XOR circuit 87, the circuit volume can be reduced.

Hereinafter, output signals of the delay elements 86a to 86c are defined as pseudo random noises PRN[2], PRN [1], PRN [0], respectively, and an output signal of the XOR circuit 87 is defined as pseudo random noise PRN [3]. The delay elements 86a to 86c delay the pseudo random noises PRN[3], PRN[2], PRN[1], which are input signals, in synchronization with the clock signal CLK to generate the pseudo random noises PRN [2], PRN[1], PRN[0], which are the output signals, respectively. The XOR circuit 87 calculates an exclusive OR operation of the pseudo random noises PRN[0] and PRN[1] to provide the pseudo random noise PRN[3], which is the result of the calculation, to the delay element 86a. Then, the pseudo random noise generating circuit 81 provides the pseudo random noises PRN[0] and PRN[1] as the pseudo random noise PRN of two bits to the D/A converter 85.

Figures 8, 9:
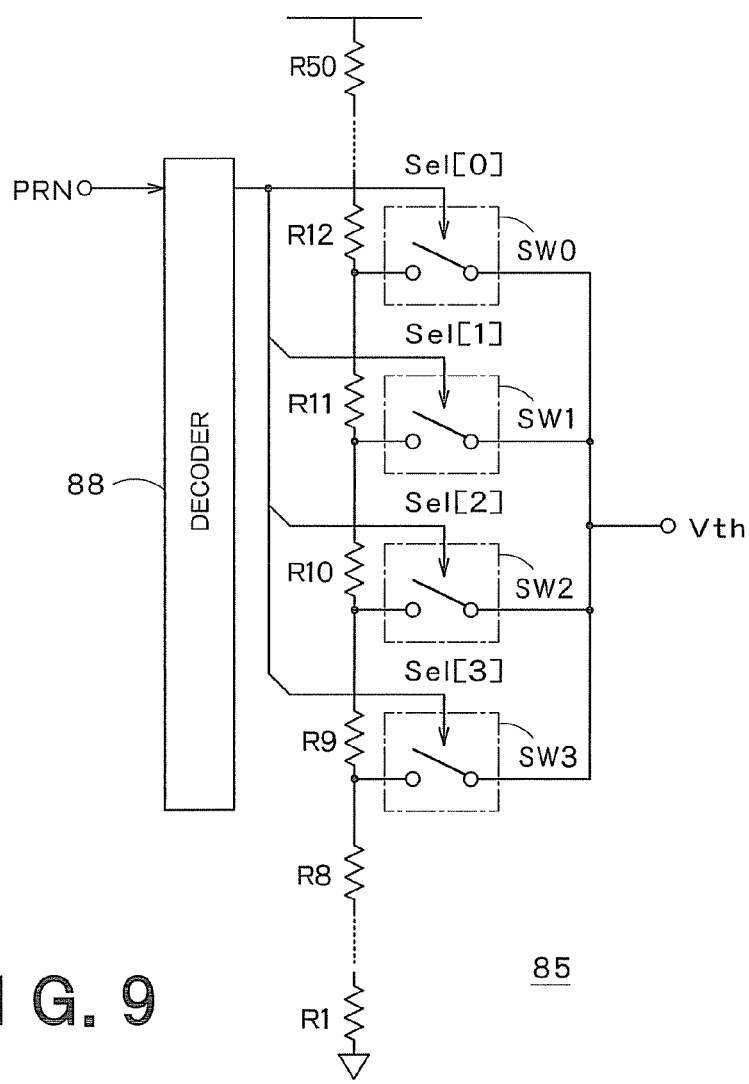
FIG. 8 is a table showing an example of an operation of the pseudo random noise generating circuit 81 of FIG. 7.
FIG. 9 is a block diagram showing an example of the internal configuration of the D/A converter 85.

FIG. 8 is a table showing an example of an operation of the pseudo random noise generating circuit 81 of FIG. 7. The pseudo random noises PRN[i] (i=0 to 3) change in synchronization with a rising edge and a falling edge of the clock signal CLK in a column direction of FIG. 8, for example. Note that the initial values of the pseudo random noises PRN[0], PRN[1] and PRN[2] are assumed to be high, low and low, respectively, and the pseudo random noise PRN[3] is set to be high by the XOR circuit 87.

As shown in FIG. 8, the pseudo random noises PRN[i] whose cycle is "7" clocks is generated. Therefore, the pseudo random noise of two bits generated by the pseudo random noise generating circuit 81, namely, values obtained by coupling the pseudo random noises PRN[0] and PRN[1] are "10", "00", "01", "10", "01", "11" and "11", which are repeated periodically.

Note that pseudo random noise of four bits obtained by further using the pseudo random noises PRN[2] and PRN[3] can be provided to the D/A converter 85. By such a manner, the threshold voltage Vth is variably controlled more finely. Furthermore, the number of the delay elements is not limited to three. By increasing the number of the delay elements, the cycle can be set longer and the number of the bits of the pseudo random noise can be increased. The pseudo random noise generating circuit 81 can output only the pseudo random noise PRN[0], for example, as a random number of one bit, which can be used in FIG. 2 and so on.

FIG. 9 is a block diagram showing an example of the internal configuration of the D/A converter 85. The D/A converter 85 of FIG. 9 has a decoder 88, resistances R1 to R50 which are connected in series, and switches SW0 to SW3. The pseudo random noise PRN of two bits is inputted to the D/A converter 85, and the D/A converter 85 outputs the threshold voltage Vth from an output terminal.

The pseudo random noise PRN of two bits is inputted to the decoder 88, and the decoder 88 generates a select signal Sel[j] (j=0 to 3) of four bits. More specifically, the decoder 88 sets one bit of the select signal Sel[j] of four bits to be high. For example, when PRN="00", Sel="0001", when PRN="01", Sel="0010", when PRN="10", Sel="0100", and when PRN="11", Sel="1000".

The resistances R1 to R50 are connected in series between a power supply terminal and a ground terminal. The power supply is, for example, 5V. A voltage of a connection node of the resistance Rk and the resistance Rk+1 (k=1 to 49) is (0.1*k) V. Four switches SW0 to SW3 are provided between the connection nodes of 1.1V, 1.0V, 0.9V and 0.8V and the output terminal, respectively. The switch SWj turns on when the select signal Sel[j] is high, and turns off when the select signal Sel[j] is low.

By above configuration, the D/A converter 85 can generate four threshold voltages Vth according to the pseudo random noise PRN of two bits. The threshold voltage Vth is provided to the first and the second comparing circuits 5 and 6. Then, the clock output circuit 7 generates the clock signal CLK having the frequency depending on the threshold voltage Vth.

As stated above, in the second embodiment, the pseudo random noise having a plurality of bits is generated by small circuits and the number of the threshold voltages Vth is more than that generated in the first embodiment. Therefore, the clock noise can be further reduced.

Third Embodiment

In the first and the second embodiments, the threshold voltage Vth is variably controlled. On the other hand, in a third embodiment, which will be explained below, the capacitors in the first and the second voltage generating circuits 3 and 4 are variably controlled to reduce the clock noise.

Figure 10:
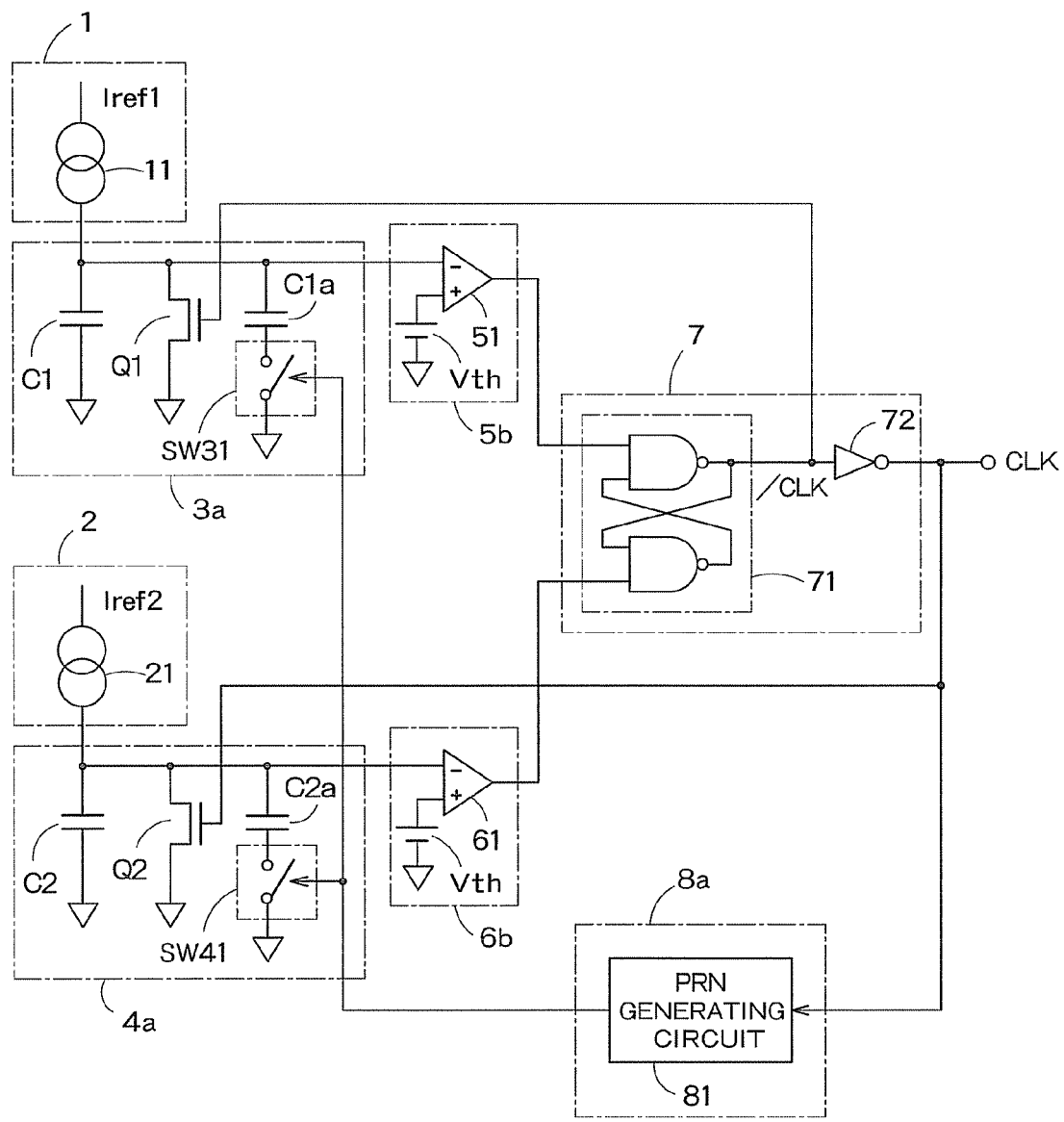
FIG. 10 is an internal configuration of a clock generating circuit 102 according to a third embodiment.

FIG. 10 is an internal configuration of a clock generating circuit 102 according to the third embodiment. In FIG. 10, components common to those of FIG. 2 have common reference numerals, respectively. Hereinafter, components different from FIG. 2 will be mainly described below.

The first voltage generating circuit 3a has a capacitor C1a and a switch SW31 which are connected in series, in addition to the capacitor C1 and the transistor Q1. The capacitor C1a and the switch SW31 are connected between the current source 11 and the ground terminal. Furthermore, the pseudo random noise generating circuit 81 in the control circuit 8 generates the pseudo random noise PRN of one bit. The switch SW31 turns on when the pseudo random noise PRN is high, and turns off when the pseudo random noise PRN is low. An internal configuration of the second voltage generating circuit 4a is similar to that of the first voltage generating circuit 3a. Here, the constant threshold voltage Vth is inputted to the first and the second comparing circuits 5b and 6b.

FIG. 11 is a timing chart showing an example of an operation of the clock generating circuit 102 of FIG. 10.

At time t20, the pseudo random noise PRN generated by the pseudo random noise generating circuit 81 is assumed to be high. In this case, because the switch SW41 in the second voltage generating circuit 4a turns on, the parallel connection composed of the capacitors C2 and C2a is formed. Therefore, the current source 21 charges both the capacitors C2 and C2a. This means that the capacitor C2 in the above equation (2) is replaced by the capacitors (C2+C2a). Therefore, the voltage VC2 increases linearly with a gradient (voltage change per a unit time) of Iref2/(C2+C2a). When the voltage VC2 becomes the threshold voltage Vth at time t21, the phase of the clock signal CLK changes from low to high. A term when the clock signal CLK is low is defined as T21 (t20 to t21).

At time t21, the phase of the clock signal CLK inverts. In synchronization therewith, it is assumed that the pseudo random noise RPN generated by the pseudo random noise generating circuit 81 changes from high to low. In this case, because the switch SW31 in the first voltage generating circuit 3a turns off, the current source 11 charges only the capacitor C1. Therefore, the voltage VC1 increases linearly with a gradient of Iref1/C1 according to the above equation (1).

The gradient of Iref1/C1 is larger than that of Iref2/(C2+C2a) of the voltage VC2 during the term T21. Therefore, the voltage VC1 becomes the threshold voltage at time t22 after a term T22 passes from time t21. Here, the term T22 is shorter than the term T21. As a result, the phase of the clock signal CLK changes from high to low.

A half cycle T21 of the clock signal CLK when the pseudo random noise PRN is high is longer than a half cycle T22 of the clock signal CLK when the pseudo random noise PRN is low. The frequency f21 for pseudo random noise PRN of high and the frequency f22 for pseudo random noise PRN of low are expressed by the following equations (7), (8), respectively.

$$f21=1/(2*T21)=Iref2/(2*(C2+C2a)*Vth) \quad (7)$$

$$f22=1/(2*T22)=Iref1/(2*C1*Vth) \quad (8)$$

Like this, the frequency of the clock signal CLK can be changed according to the pseudo random noise PRN.

As stated above, the third embodiment determines whether or not to charge the capacitors C1a and C2a according to the pseudo random noise PRN generated by the pseudo random noise generating circuit 81. Therefore, the frequency of the clock signal CLK is dispersed into two values, thereby reducing the clock noise.

Note that by providing two or more pairs of a capacitor and a switch connected in series in the first and the second voltage generating circuits 3a and 4a and generating the pseudo random noise having a plurality of bits by the pseudo random noise generating circuit 81, the current sources 11 and 21 can charge the capacitors the number of which depends on the pseudo random noise PRN. By such a manner, the frequency of the clock signal CLK is further dispersed, thereby further reducing the clock noise.

Fourth Embodiment

In a fourth embodiment, which will be explained below, the current generated by the first and the second current generating circuits 1 and 2 are variably controlled to reduce the clock noise.

FIG. 12 is an internal configuration of a clock generating circuit 103 according to the fourth embodiment. In FIG. 12, components common to those of FIG. 2 have common reference numerals, respectively. Hereinafter, components different from FIG. 2 will be mainly described below.

The first current generating circuit is has a current source 11a and a switch SW12 which are connected in series, in addition to the current source 11 for generating the constant current Iref1. The current source 11a generates a constant current Iref1a. Furthermore, the pseudo random noise generating circuit 81 in the control circuit 8 generates the pseudo random noise PRN of one bit. The switch SW12 turns on when the pseudo random noise PRN is high, and turns off when the pseudo random noise PRN is low. An internal configuration of the second current generating circuit 2a is similar to that of the first current generating circuit 1a. Here, the constant threshold voltage Vth is inputted to the first and the second comparing circuits 5b and 6b.

FIG. 13 is a timing chart showing an example of an operation of the clock generating circuit 103 of FIG. 12.

At time t30, the pseudo random noise PRN generated by the pseudo random noise generating circuit 81 is assumed to be low. In this case, because the switch SW22 in the second current generating circuit 2a turns off, only the constant current Iref2 is provided to the second voltage generating circuit 4. Therefore, the voltage VC2 increases linearly with a gradient of Iref2/C2. When the voltage VC2 becomes the threshold voltage Vth at time t31, the phase of the clock signal CLK changes from low to high. A term when the clock signal CLK is low is defined as T31 (t30 to t31).

At time t31, the phase of the clock signal CLK inverts. In synchronization therewith, it is assumed that the pseudo random noise RPN generated by the pseudo random noise generating circuit 81 changes from low to high. In this case, because the switch SW12 in the first current generating circuit 1a turns on, sum of the constant currents Iref1 and Iref1a is provided to the first voltage generating circuit 3. This means that the constant current Iref1 in the above equation (1) is replaced by the constant current (Iref1+Iref1a). Therefore, the voltage VC1 increases linearly with a gradient of (Iref1+Iref1a)/C1.

The gradient of (Iref1+Iref1a)/C1 is larger than that of Iref2/C2 of the voltage VC2 during the term T31. Therefore, the voltage VC1 becomes the threshold voltage at time t32, which is after a term T32 passes from time t32. Here, the term T32 is shorter than the term T31. As a result, the phase of the clock signal CLK changes from high to low.

A half cycle T32 of the clock signal CLK when the pseudo random noise PRN is high is shorter than a half cycle T31 of the clock signal CLK when the pseudo random noise PRN is low. The frequency f31 for pseudo random noise PRN of high and the frequency f32 for pseudo random noise PRN of low are expressed by the following equations (9), (10), respectively.

$$f31=1/(2*T31)=Iref2/(2*C2*Vth) \quad (9)$$

$$f32=1/(2*T32)=(Iref1+Iref1a)/(2*C1*Vth) \quad (10)$$

Like this, the frequency of the clock signal CLK can be changed according to the pseudo random noise PRN.

As stated above, the fourth embodiment determines whether or not to provide the constant currents Iref1a and Iref2a from the current sources 11a and 21a to the first and the second voltage generating circuits 3 and 4, respectively according to the pseudo random noise PRN generated by the pseudo random noise generating circuit 81. Therefore, the frequency of the clock signal CLK is dispersed into two values, thereby reducing the clock noise.

Note that by providing two or more pairs of a current source and a switch connected in series in the first and the second voltage generating circuits 1a and 2a and generating the pseudo random noise having a plurality of bits by the pseudo random noise generating circuit 81, currents generated by the current sources the number of which depends on the pseudo random noise are provided to the first and the second voltage generating circuits 3 and 4 as the first and the second currents, respectively. By such a manner, the frequency of the clock signal CLK is further dispersed, thereby further reducing the clock noise.

Note that in the above described embodiments, although an example is shown where the control circuit 8 generates a pseudo random noise, the control circuit 8 can generate an arbitrary random number without a specific cycle.

The clock generating circuits shown in FIG. 2 and so on are only examples, and various modification can be conceivable. Some modified examples will be explained below.

Figure 14:
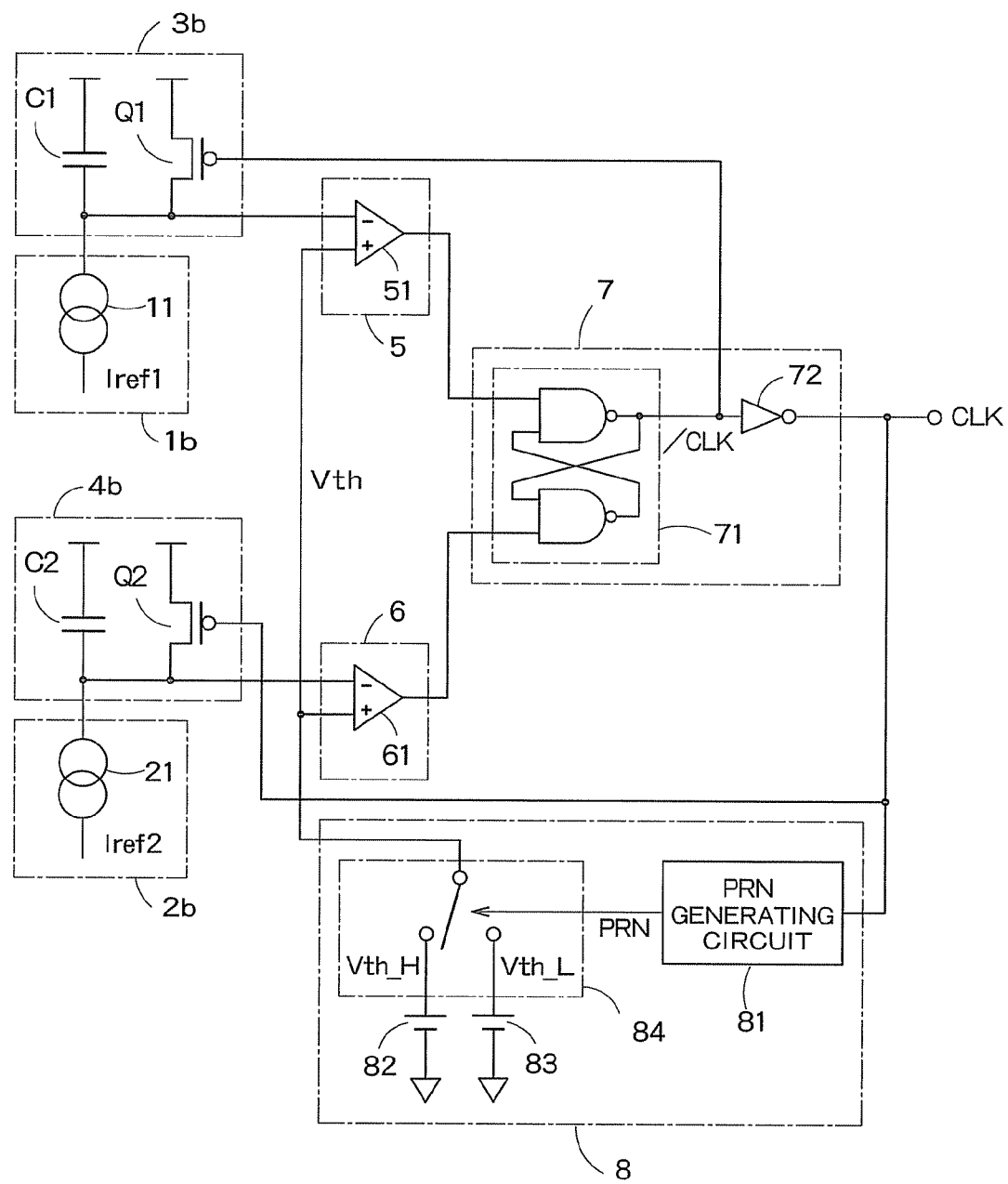
FIG. 14 is an internal configuration of a clock generating circuit 104, which is a modified example of FIG. 2.

FIG. 14 is an internal configuration of a clock generating circuit 104, which is a modified example of FIG. 2. The circuit configuration of FIG. 14 is obtained by inverting the conductivity type of the transistors of FIG. 2 and switching the power supply terminal and the ground terminal. The current sources 11 and 12 discharge the capacitors C1 and C2. The other conceptual operating principle is similar to that of FIG. 2. Similar modification can be applicable to the clock generating circuits shown in FIG. 10 and so on.

FIG. 15 is an internal configuration of a clock generating circuit 105, which is another modified example of FIG. 2. FIG. 16 is a timing chart showing an example of an operation of the clock generating circuit 105. The first current generating circuit 1c of the clock generating circuit 105 of FIG. 15 has a resistance 13, and the second current generating circuit 20 is has a resistance 23. In this case, the currents generated by the first and the second current generating circuits 1c and 2c are not constant. Therefore, the voltages VC1 and VC2 do not increase linearly as shown in FIG. 16. However, the clock signal CLK can be generated in synchronization with timing when the voltages VC1 and VC2 becomes the threshold voltage Vth and the outputs of the first and the second comparing circuits 5 and 6 change.

In other example, at least a part of MOS transistors can be replaced by other semiconductor devices such as bipolar transistors or Bi-CMOS transistors. The clock generating circuit can be formed on a semiconductor substrate or on a plurality of semiconductor chips separately. Furthermore, the clock generating circuit can be implemented by using discrete parts on a printed circuit board and so on.

Figure 17:
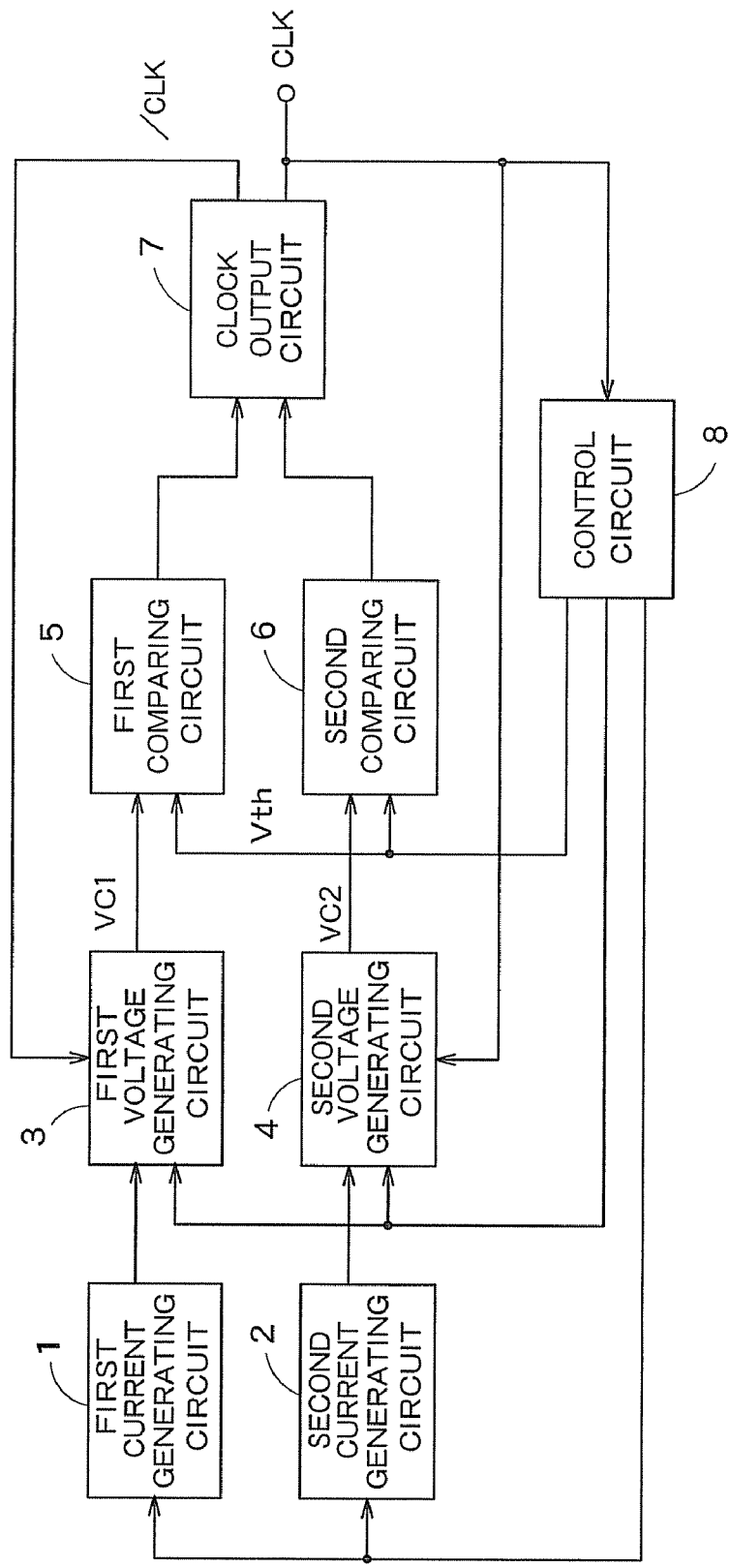
FIG. 17 is a schematic configuration of a clock generating circuit 106, which is a modified example of FIG. 1.

FIG. 17 is a schematic configuration of a clock generating circuit 106, which is a modified example of FIG. 1. The control circuit 8 can variably control one or more of the current generated by the first current generating circuit 1, the current generated by the second current generating circuit 2, the volume of the capacitor in the first voltage generating circuit 3, the volume of the capacitor in the second voltage generating circuit 4, the threshold voltage of the first comparing circuit 5, and the threshold voltage of the second comparing circuit 6. By variably controlling two or more parameters, the frequency of the clock signal CLK further disperses, thereby further reducing the clock noise.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. A clock generating circuit comprising:
   a first current generating circuit configured to generate a first current;
   a first voltage generating circuit configured to generate a first voltage which increases or decreases according to a phase of a clock signal as time advances by the first current;
   a first comparing circuit configured to compare the first voltage with a first threshold voltage to generate a first comparison result;
   a second current generating circuit configured to generate a second current;
   a second voltage generating circuit configured to generate a second voltage which increases or decreases according to the phase of the clock signal as time advances by the second current;
   a second comparing circuit configured to compare the second voltage with a second threshold voltage to generate a second comparison result;
   a clock output circuit configured to generate the clock signal whose phase inverts in synchronization with timing when the first and the second comparison results change; and
   a control circuit configured to generate a random number and configured to variably control at least one of the first current, the second current, the first threshold voltage and the second threshold voltage according to the random number.

2. The circuit of claim 1, wherein the control circuit is configured to generate the random number in synchronization with the clock signal.

3. The circuit of claim 1, wherein the first voltage generating circuit comprises a first capacitor charged or discharged by the first current, and
   the first voltage generating circuit is configured generate the first voltage which increases as time advances by charging the first capacitor when the phase of the clock signal is a first value, and is configured generate the first voltage which decreases as time advances by discharging the first capacitor when the phase of the clock signal is a second value different from the first value,
   wherein the second voltage generating circuit comprises a second capacitor charged or discharged by the second current, and
   the second voltage generating circuit is configured generate the second voltage which increases as time advances by charging the second capacitor when the phase of the clock signal is the second value, and is configured generate the second voltage which decreases as time advances by discharging the second capacitor when the phase of the clock signal is the first value.

4. The circuit of claim 3, wherein the first voltage generating circuit comprises a first switch connected in parallel with the first capacitor, the first switch being configured to turn off when the phase of the clock signal is the first value and turn on when the phase of the clock signal is the second value, and
   the second voltage generating circuit comprises a second switch connected in parallel with the second capacitor, the second switch being configured to turn off when the phase of the clock signal is the second value and turn on when the phase of the clock signal is the first value.

5. The circuit of claim 3, wherein the control circuit is configured to variably control at least one of the first current, the second current, the first threshold voltage, the second threshold voltage, a volume of the first capacitor and a volume of the second capacitor according to the random number.

6. The circuit of claim 3, wherein at least one of the first and the second voltage generating circuits comprises a plurality of capacitors, and a first number of the plurality of capacitors is charged or discharged, the first number depending on the random number.

7. The circuit of claim 6, wherein at least one of the first and the second voltage generating circuits comprises a plurality of switches configured to be controlled depending on the random number, each of the plurality of switches and each of the plurality of capacitors being connected in series.

8. The circuit of claim 1, wherein the control circuit comprises:
a random number generating circuit configured to generate the random number;
a first voltage source configured to generate a first reference voltage;
a second voltage source configured to generate a second reference voltage different from the first voltage; and
a select circuit configured to select one of the first and the second reference voltages according to the random number and to set the selected reference voltage as at least one of the first and the second threshold voltages.

9. The circuit of claim 1, wherein the control circuit comprises:
a random number generating circuit configured to generate the random number, the random number being a digital signal having a plurality of bits; and
a D/A (Digital to Analog) converter configured to convert the digital signal to a corresponding analog voltage to set the analog voltage as at least one of the first and the second threshold voltages.

10. The circuit of claim 9, wherein the random number generating circuit comprises:
a plurality of delay elements connected in series, each of the plurality of delay elements being configured to delay an input signal in synchronization with the clock signal; and
a exclusive OR circuit configured to input a value obtained by performing an exclusive OR operation of an output of a last stage of a delay element of the plurality of delay elements and an output of another delay element of the plurality of delay elements to a first stage of a delay element of the plurality of delay elements,
wherein the random number generating circuit is configured to output at least one output of the plurality of delay elements as the random number.

11. The circuit of claim 9, wherein the D/A converter comprises:
a plurality of resistances connected in series;
a plurality of switches, each of the plurality of switches being connected between an output terminal of the D/A converter and a connection node of two of the plurality of resistances; and
a decoder configured to turn on one of the plurality of switches according to the random number,
wherein the analog voltage is outputted from the output terminal.

12. The circuit of claim 1, wherein at least one of the first and the second current generating circuits comprises a plurality of current sources, and a first number of the plurality of current sources generates the first or the second current, the first number depending on the random number.

13. The circuit of claim 12, wherein at least one of the first and the second current generating circuits comprises a plurality of switches configured to be controlled depending on the random number, each of the plurality of switches and each of the plurality of current sources being connected in series.

14. The circuit of claim 1, wherein the first current generating circuit comprise a first resistance between a reference voltage terminal and the first voltage generating circuit, and
the second current generating circuit comprises a second resistance between the reference voltage terminal and the second voltage generating circuit.

15. The circuit of claim 1, wherein the random number has a predetermined cycle, and the random number varies in a random manner in the cycle.

16. The circuit of claim 1, wherein the clock output circuit is configured to generate an inverted clock signal of the clock signal, and
the control circuit is configured to variably control at least one of the second current and the second threshold voltage according to the clock signal and is configured to variably control at least one of the first current and the first threshold voltage according to the inverted clock signal.

* * * * *